US010600617B1

(12) United States Patent
Isozaki et al.

(10) Patent No.: US 10,600,617 B1
(45) Date of Patent: Mar. 24, 2020

(54) PLASMA PROCESSING APPARATUS

(71) Applicant: HITACHI HIGH-TECHNOLOGIES CORPORATION, Minato-ku, Tokyo (JP)

(72) Inventors: Masakazu Isozaki, Tokyo (JP); Takahisa Hashimoto, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/569,161

(22) Filed: Sep. 12, 2019

(30) Foreign Application Priority Data

Nov. 8, 2018 (JP) .................................. 2018-210166

(51) Int. Cl.
*H01L 21/67* (2006.01)
*H01J 37/32* (2006.01)

(52) U.S. Cl.
CPC .. *H01J 37/32009* (2013.01); *H01L 21/67196* (2013.01); *H01J 37/32449* (2013.01); *H01J 37/32788* (2013.01)

(58) Field of Classification Search
CPC ..... H01J 37/32; H01J 37/32009; H01L 21/67; H01L 21/6719; H01L 21/67196; H01L 21/67126; H01L 21/677
See application file for complete search history.

(56) References Cited

U.S. PATENT DOCUMENTS

| 2005/0051098 | A1* | 3/2005 | Aramaki | ............. C23C 16/4581 |
| | | | | 118/728 |
| 2010/0186672 | A1* | 7/2010 | Okuda | ................ C23C 16/4586 |
| | | | | 118/723 R |
| 2016/0217976 | A1* | 7/2016 | Uemura | ............. C23C 16/4412 |
| 2016/0261526 | A1 | 9/2016 | Kodama | |
| 2018/0211893 | A1* | 7/2018 | Ichino | ..................... H01L 22/30 |

FOREIGN PATENT DOCUMENTS

| JP | 2005101598 A | 4/2005 |
| JP | 2016-162266 A | 9/2016 |

* cited by examiner

Primary Examiner — Thai Pham
(74) Attorney, Agent, or Firm — Miles & Stockbridge, P.C.

(57) ABSTRACT

A plasma processing apparatus includes: a vacuum chamber in which plasma is formed; an inner chamber detachable from the vacuum chamber; a sample stage disposed in the inner chamber; a sample stage ring base disposed in the inner chamber; and a suspension beam coupled to the sample stage ring base in a space between the vacuum chamber and the inner chamber. With the inside of the vacuum chamber hermetically sealed, the inner chamber is placed on the sample stage ring base, and the inside is hermetically sealed. The upper part of the suspension beam is vertically movably held to a sample stage base plate configuring the upper part of the vacuum chamber to cover the inside. The plasma processing apparatus includes a conductive connector sandwiched between the suspension beam made of SUS and the upper part of the member and the sample stage base plate.

5 Claims, 5 Drawing Sheets

PLASMA PROCESSING APPARATUS

BACKGROUND

The present invention relates to a plasma processing apparatus that processes a board-shaped sample, such as a semiconductor wafer placed on the top face of a sample stage disposed in a processing chamber using plasma formed in the processing chamber in a vacuum container in the process step of producing a semiconductor device, and specifically to a plasma processing apparatus that processes a wafer placed on the top face of a sample stage while the temperature is adjusted by a thermoregulator, such as a heater, disposed in the inside of the sample stage.

Conventionally, to a plasma processing apparatus that subjects a film layer disposed on the surface of a semiconductor wafer (in the following, a wafer) to processing, such as etching, and produces a semiconductor device, it is demanded to provide the reliability of processing that enables the miniaturization or high precision processing of the film layer on the wafer surface or enables such processing with the restraint on variation in the processed result for a long time. It is also demanded to improve the efficiency of processing and improve the number (the throughput) of wafers to be processed within a unit time.

In order to solve such problems, in the conventional plasma processing apparatus, an apparatus having a configuration including a temperature regulator is thought. The temperature regulator is disposed in the processing chamber in the inside of the vacuum container where a wafer is processed, and the temperature regulator enables the regulation of the temperature of the top face of the sample stage or a wafer placed on the top face to temperatures in desired range. Alternatively, an apparatus having a configuration is known in which the space in the inside of the processing chamber is in axial symmetry, the variation in the evacuation from the processing chamber and the variation in the density of products, for example, generated in the processing chamber and evacuated to the outside of the processing chamber with the evacuation about the center axis can be reduced.

An apparatus having a structure of a processing chamber is thought in which the eccentricity of a passage in the processing chamber through which particles, such as a gas or plasma, flow is reduced and the velocity or amount of the flow is made equally close in the circumferential direction. In order to improve throughput, an apparatus including a so-called multi-chamber is known in which a plurality of processing chambers where wafers are processed is coupled through a transfer chamber that transfers wafers in its inside, or an apparatus including a configuration is known in which transfer chambers are coupled with a relay chamber that can accommodate wafers in its inside.

As an example of such a plasma processing apparatus or a vacuum processing apparatus, an apparatus disclosed in Japanese Unexamined Patent Application Publication No. 2005-101598 is known.

On the other hand, in order to achieve high integration of semiconductor devices nowadays, many kinds of materials and a variety of integrated structures are being used in semiconductor devices. In order to cope with such trends, plasma processing apparatuses in various methods are being developed. For plasma generation in such plasma processing apparatuses, the inductive coupling method, the electron cyclotron resonance method, and the parallel plate method (including the magnetron method) are mainly used. Typically, for the electron cyclotron resonance method, electric fields in an electromagnetic wave band of 2.45 GHz or the VHF band in a range of about 30 to 300 MHz (more preferably, 30 to 200 MHz) are used, and in the inductive coupling method and the parallel plate method, electric fields in a radio frequency band of 13.56 MHz are mainly used.

As a typical plasma processing apparatus that generates plasma by the parallel plate method, a typical apparatus includes a disk-shaped upper electrode and a lower electrode. The upper electrode is disposed covering a processing chamber in the inside of a vacuum container from above, and electrically connected to a radio frequency power supply that supplies electric power at the radio frequency described above. The lower electrode in a disk or a cylindrical shape is disposed in the inside of a sample stage below the processing chamber, and the upper electrode and is disposed opposite to the top face of sample stage. The lower electrode is supplied with electric power at a frequency smaller than the frequency of radio frequency electric power for forming plasma. The apparatus includes a conductor disposed below the bottom face of the upper electrode and configuring the ceiling face of the processing chamber or a dielectric shower plate having a plurality of gas inlet holes through which a processing gas is introduced into the processing chamber. Using the processing gas, plasma is formed in the processing chamber between the upper electrode and the lower electrode, and a wafer placed on the top face of the sample stage is processed. As an example of such a plasma processing apparatus, an apparatus disclosed in Japanese Unexamined Patent Application Publication No. 2016-162266 is known.

SUMMARY

In the conventional techniques, problems arise because of insufficient consideration on the points below.

In a plasma processing apparatus that forms plasma using a parallel plate, nowadays, electric fields at a radio frequency of the VHF band are used, enabling the improvement of plasma density and plasma generation in a low pressure range. In order that with radio frequency electric power supplied to the lower electrode disposed in the inside of the sample stage, charged particles, such as ions, in plasma are induced and entered to the wafer surface for collision and etching the wafer surface of a process target film layer is relatively promoted in the incident direction, conventionally, radio frequency electric power of a frequency band of a few hundreds kHz to a few MHz is supplied to the lower electrode to form a bias potential above the sample stage or the top face of a wafer. In order to further improve the energy controllability of incident ions, electric power at a frequency higher than a conventional frequency tends to be used.

In the case in which such plasma processing apparatuses are used in the process steps of producing semiconductors in a configuration in which such plasma processing apparatuses is coupled to each other, many frequencies are possibly used in order that the efficiency of processing and throughput are improved by consistently performing the process steps with one wafer disposed in the processing chamber of one plasma processing apparatus. In this case, the conventional techniques do not consider a problem that a desired processed result is not achieved due to the interference of electric fields between the plasma processing apparatuses.

In Japanese Unexamined Patent Application Publication No. 2005-101598 described above, a vacuum container configuring one processing unit has a so-called multi chamber having another container in the inside (the inner chamber), and the inner side of the inner chamber is used as a processing chamber in which a wafer is disposed and plasma is formed for processing wafers. Typically, in order to obtain stable plasma, the inner wall of the processing chamber facing plasma is desirably set to a specific potential. For example, in Japanese Unexamined Patent Application Publication No. 2016-162266, the member of the side wall of the vacuum container configuring the inner side wall surrounding the processing chamber is set to a ground potential.

The sample stage disposed in the inside of the inner chamber disclosed in Japanese Unexamined Patent Application Publication No. 2005-101598 is disposed on the outer circumference side of the sample stage. The inner circumference side portion of a sample stage ring base in a ring shape surrounding the sample stage is connected to the outer circumference side portion of the sample stage through poles. The outer circumference side portion of the sample stage ring base is connected to the lower end portions of suspension beams, and the sample stage is suspended below from a sample stage base plate coupled and held to the upper end portions of the suspension beams. The sample stage base plate has a configuration in which the sample stage base plate is placed on the top end of a member configuring the side wall of the vacuum container that is a member configuring an outer chamber as a vacuum container located on the outer side, the sample stage base plate is attached to the member, the surfaces of the members are connected to each other, and a sealing member, such as an O-ring, sandwiched between the members hermetically seals the outside and the inside of the vacuum container. In such a configuration, in order to set the potential of the suspension beams to a ground potential, the suspension beams are electrically connected, through a conductive member, to the sample stage base plate configuring the vacuum container, connected to the outer chamber, and having a ground potential.

On the other hand, in the configuration described above, the sample stage, in which the sample stage ring base having the sample stage base plate configuring the vacuum container is held from the outer chamber with the suspension beams and the sample stage is connected to the sample stage ring base, has to be held floating above the sample stage ring base with a slight distance to the lower member. With a change in the conditions in the processing chamber, the suspension beam and the sample stage ring base are slightly vertically displaced. Thus, Japanese Unexamined Patent Application Publication No. 2005-101598 and Japanese Unexamined Patent Application Publication No. 2016-162266 have insufficient consideration on the points that restrain wear on the members electrically connecting the suspension beams to the sample stage base plate with such displacement and the leakage of radio frequency electric power among the suspension beams, the sample stage base plate, and the vacuum container. Therefore, in the previously existing techniques, the occurrence the wear of the members or electric power leakage due to the wear causes problems on driving the plasma processing apparatus, resulting in a risk of impairing the yields or throughput of processing.

An object of the present invention is to provide a plasma processing apparatus that improves yields or the efficiency of processing.

The object is to achieved by a plasma processing apparatus including: a vacuum chamber that is grounded, the vacuum chamber configuring a vacuum container and a cover member disposed on an upper part of the vacuum chamber; an inner chamber disposed in the vacuum chamber, the inner chamber having an inner chamber to which a processing gas is supplied to form plasma, the inner chamber being detachable from the vacuum chamber; a sample stage disposed at a center part in the inner chamber, the sample stage on which a wafer is placed on a top face of the sample stage; an evacuation opening disposed on a center part of a bottom part of the inner chamber below the sample stage, the evacuation opening through which an inside of the inner chamber is evacuated; a vacuum pump disposed below the sample stage below the vacuum chamber, the vacuum pump being configured to communicate with the evacuation opening to evacuate the inside of the inner chamber; a sample stage ring base disposed in the inner chamber, the sample stage ring base being disposed in a ring shape around below the sample stage, the sample stage ring base being coupled to the sample stage through a support beam horizontally extending; a suspension beam vertically disposed extending in a space between the vacuum chamber and inner chamber, the suspension beam being coupled to the sample stage ring base, the suspension beam being configured to suspend the sample stage and support the sample stage from above; and a piping disposed on an inner side of the suspension beam and the support beam, the piping through which a liquid to be supplied to an inside of the sample stage is circulated. In a state in which the cover member is placed on the vacuum chamber and an inside of the vacuum chamber is hermetically sealed, the inner chamber is placed on the sample stage ring base and an inside of the inner chamber is hermetically sealed to the vacuum chamber and is hermetically sealed to an outside of the vacuum chamber, the suspension beam is vertically movably held a space sandwiched between a sample stage base plate and the cover member of the vacuum container, the sample stage base plate having an upper part configuring the upper part of the vacuum chamber, the sample stage base plate covering an inside of the vacuum container, and the plasma processing apparatus includes a conductive connector held on the sample stage base plate being sandwiched between the sample stage base plate and an upper member made of SUS of the suspension beam.

DETAILED DESCRIPTION

In the following, an embodiment of the present invention will be described with reference to the drawings.

Embodiment

In the following, an embodiment of the present invention will be described with reference to FIGS. 1 to 5.

Figure 1:
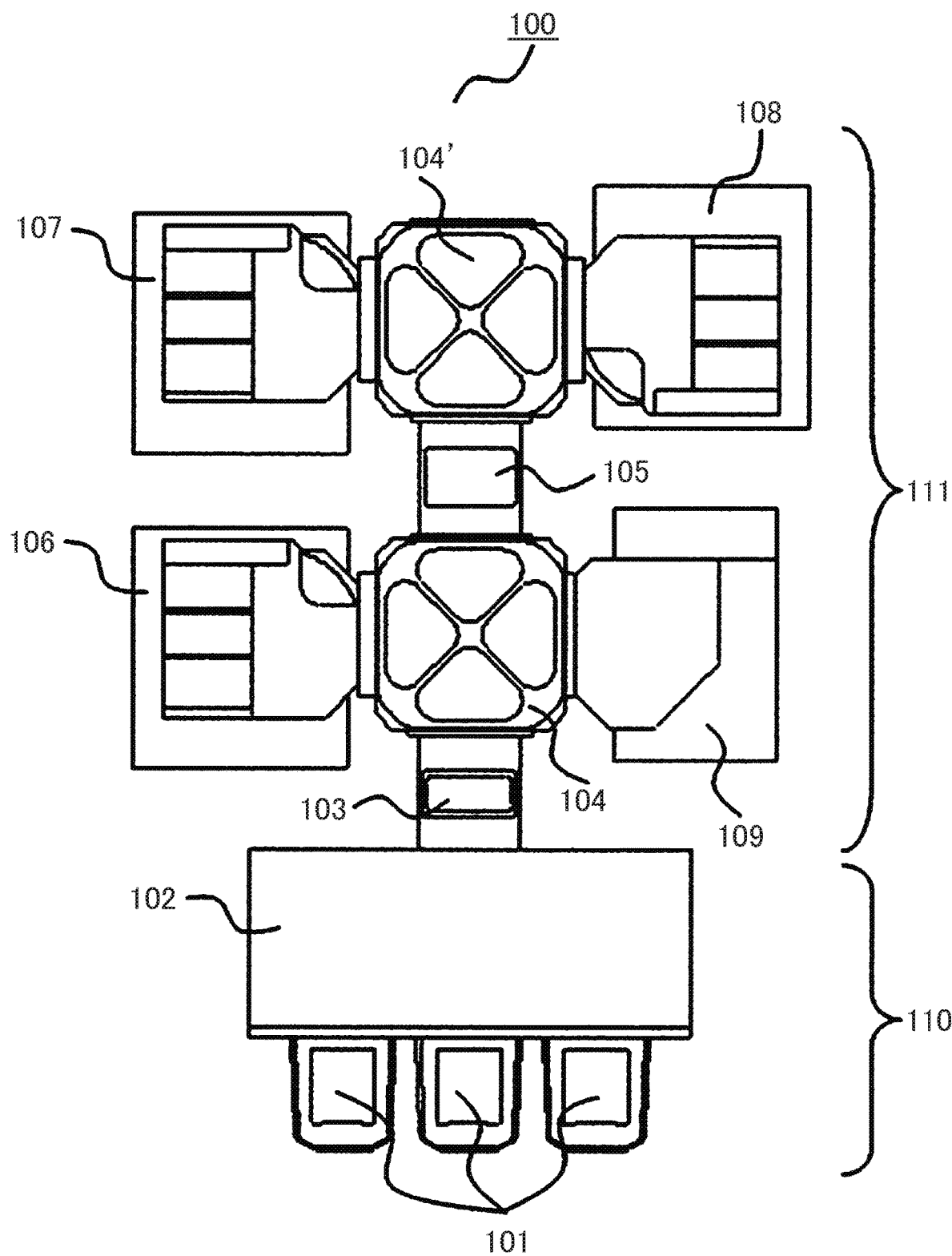
FIG. 1 is a top view showing the outline of the configuration of a vacuum processing apparatus according to an embodiment of a plasma processing apparatus of the present invention.

FIG. 1 is a top view showing the outline of the configuration of a vacuum processing apparatus according to an embodiment of a plasma processing apparatus of the present invention. In FIG. 1, a vacuum processing apparatus 100 is configured of two blocks, an atmospheric block 110 on the front side that is the lower side in FIG. 1 and a vacuum block 111 on the rear side in FIG. 1, and the atmospheric block 110 is connected to the vacuum block 111 on the back face of the atmospheric block 110.

The atmospheric block 110 is a place where semiconductor substrates (wafers) are handed under the atmospheric pressure. The atmospheric block 110 includes a plurality of cassette stages 101 and an atmosphere-side sample transfer chamber 102. The cassette stages 101 are located on the front side of the apparatus, horizontally disposed side by side, and mountable with a housing cassette on the cassette stage 101. The housing cassette is a container that can accommodate semiconductor wafers as a plurality of samples in the inside of the housing cassette. The cassette stages 101 are coupled to or mounted on the front side of the atmosphere-side sample transfer chamber 102. The atmosphere-side sample transfer chamber 102 has a rectangular cuboid or an approximate shape regarded as similar to the rectangular cuboid. The atmosphere-side sample transfer chamber 102 has a transfer chamber that is a space pressurized to an atmospheric pressure or to an approximate pressure regarded as similar to the atmospheric pressure to a sample and the space to which wafers are transferred. In the transfer chamber, a transfer robot (not shown) is disposed. The transfer robot moves and transfers a sample while extending and contracting the arm holding the sample on the end portion of the arm.

The vacuum block 111 includes a lock chamber 103 in which samples transferred to the inside by the transfer robot are accommodated, a plurality of vacuum-side sample transfer chambers 104 and 104' each including a sample transfer space in the pressure-reduced inside, an intermediate chamber 105 disposed between these two vacuum-side sample transfer chambers and coupling the two vacuum-side sample transfer chambers to each other, and vacuum processing units 106, 107, 108, and 109 each including a vacuum container having a processing chamber in which a sample is transferred to the inside and processed. The lock chamber 103 is a vacuum container having one side connected to the back face of the atmosphere-side sample transfer chamber 102 and the other side coupled to the vacuum-side sample transfer chamber 104.

The vacuum-side sample transfer chamber 104 has a rectangular shape or an approximate shape to the rectangular shape when viewed from above. The vacuum processing units 106 and 107 are coupled to the left and right side faces corresponding to the left and right edges of the rectangle in FIG. 1, and the back face that is the remaining upper face is coupled to the intermediate chamber 105. The intermediate chamber 105 has a housing chamber that is a space in which samples are accommodated in the inside. The intermediate chamber 105 is connected to the back face of the vacuum-side sample transfer chamber 104 at the lower end portion in FIG. 1 and connected to the vacuum-side sample transfer chamber 104' at the upper end portion in FIG. 1. The intermediate chamber 105 joins the vacuum-side sample transfer chamber 104 to the vacuum-side sample transfer chamber 104'. Similarly to the vacuum-side sample transfer chamber 104, the vacuum-side sample transfer chamber 104' is attached to the vacuum processing units 108 and 109 on the left and right side faces. The vacuum-side sample transfer chamber 104' couples the vacuum processing unit 108 to the vacuum processing units 108 and 109.

The vacuum block 111 is thus coupled the atmospheric block 110, and hence the sample housing cassettes are coupled to the vacuum processing units, i.e., wafers can be supplied to the vacuum processing units. The embodiment is described in which the vacuum processing units 106, 107, and 108 are etching processing units and the vacuum processing unit 109 is an asking processing unit. However, in the actual plasma processing apparatus, the device configuration is different in each process step to be requested, and the embodiment is non-limiting.

The lock chamber 103 is coupled to a vacuum evacuation device, such as a rotary pump, not shown, and is configured to variably adjust the pressure in the space that can accommodate a sample disposed in the lock chamber 103 to a pressure between an atmospheric pressure or an approximate pressure value to the atmospheric pressure and a predetermined pressure value of a low vacuum degree. A plurality of sample housing chambers is included or the sample housing chamber is partitioned into a plurality of regions each of which can accommodate a sample. In each inside, a stage, on the top face of which a sample is held, or a rack, on which the outer edge portion of a sample is placed and held, is disposed. The pressure in the inside is changed with the sample held.

The vacuum-side sample transfer chambers 104 and 104' are configured of a vacuum container having a polygon (a rectangle in the embodiment) in a planar shape. Similarly to the lock chamber 103, the vacuum-side sample transfer chambers 104 and 104' are coupled to a vacuum evacuation device (not shown), the pressure in the inside of the vacuum transfer chamber that is a space in which a sample on the inner side is held and transferred is maintained at a predetermined pressure of a low vacuum degree. In the center part of the inside of the vacuum transfer chamber of each of the vacuum-side sample transfer chambers 104 and 104' in the horizontal direction, a vacuum transfer robot (not shown) that is a device transferring a sample placed on its arm is disposed. These vacuum transfer robots rotate and extend and contract the arms to transfer a sample between the lock chamber 103 and the processing units 106 and 109 and between the lock chamber 103 and the intermediate chamber 105 in the vacuum-side sample transfer chamber 104, and between the intermediate chamber 105 and the processing units 107 and 108 in the vacuum-side sample transfer chamber 104'.

The intermediate chamber 105 is configured of a vacuum container in which the end portions in the longitudinal direction of the vacuum processing apparatus 100 of the vacuum container are coupled to the vacuum-side sample transfer chambers 104 and 104' and the inside space is communicated with the vacuum transfer chambers. The space in the inside of the intermediate chamber 105 is a space in which a plurality of samples is accommodated in the vertical direction with a spacing, and a plurality of sample stages each having a top face on which a sample is placed or a rack that supports a sample with the outer edge portion of the sample placed.

Between two end portions of the lock chamber 103 in the longitudinal direction and the transfer chambers in the inside of the atmosphere-side sample transfer chamber 102 and the vacuum-side sample transfer chamber 104, a gate valve is disposed. The gate valve is driven by a drive, such as an actuator, not shown, and vertically moves to open and hermetically close the end portion of a sample passage communicating between the housing space in the inside of the lock chamber 103 and the transfer chamber. A gate valve having a similar structure and operational functions is also disposed between the intermediate chamber 105 and the vacuum-side sample transfer chambers 104 and 104', between the vacuum-side sample transfer chamber 104 and the processing units 106 and 109, and between the vacuum-side sample transfer chamber 104' and the processing units 107 and 108. The gate valve opens and hermetically closes the end portion of the sample passage communicating between the sample housing chamber in the inside and the transfer chamber, or between the transfer chamber and the processing chamber in the inside of the vacuum container of the processing unit. The gate valves are configured such that when a sample is passed through the passage and transferred, the gate valves are opened, after sample transfer is finished, the gate valves hermetically close the passage to seal the sample housing spaces in the vacuum container units, and the gate valves can maintain the pressure the space in the inside of at a predetermined pressure of a low vacuum degree.

The lock chamber 103 and the intermediate chamber 105 are regions in which unprocessed samples and processed samples are temporarily accommodated and then the samples are transferred in the longitudinal direction of the vacuum processing apparatus 100. The direction in which unprocessed samples are transferred on the rear side can be distinguished as a loading side and the direction in which processed samples are transferred to the front side can be distinguished as an unloading side.

Note that in the embodiment, a pipe coupled to the inlet of the vacuum evacuation device, such as a rotary pump, is not connected to the vacuum container configuring the intermediate chamber 105. The housing space in the inside of the intermediate chamber 105 is evacuated together with the vacuum transfer chamber by the operation of the vacuum evacuation device connected to any of the vacuum-side sample transfer chambers 104 and 104', which are communicated, by opening at least any of the gate valves disposed on the front end side and the rear end side. Thus, the pressure in the housing space in the inside of the intermediate chamber 105 is turned to the same pressure as the pressure in the inside of the vacuum transfer chamber or an approximate pressure regarded as similar to the pressure.

The vacuum processing apparatus 100 thus configured, a plurality of samples placed on the cassette stage 101 and accommodated in the sample housing cassette coupled to the atmosphere-side sample transfer chamber 102 is each placed on the top face of the holding unit at the arm end portion by the operation of the transfer robot disposed in the atmosphere-side sample transfer chamber 102, and then transferred one by one to the inside of the lock chamber 103. In the transfer, in the inside of the lock chamber 103, the gate valve facing the atmosphere-side sample transfer chamber 102 on the front side (the unloading side) of the vacuum processing apparatus 100 is opened with the entry of the transfer robot arm, the housing space in the inside of the lock chamber 103 is communicated with the atmospheric transfer chamber in the atmosphere-side sample transfer chamber 102, and the pressure is the atmospheric pressure the same as the inside of the atmospheric transfer chamber or the pressure having an approximate value. After the sample is placed on the holding stage or the rack in the inside of the lock chamber 103, the gate valve is closed, the housing space sealed, and then the pressure is reduced to a value at a predetermined vacuum degree that is provided.

After the pressure in the housing space in the lock chamber 103 is the same as the pressure in the vacuum transfer chamber in the vacuum-side sample transfer chamber 104 or an approximate value regarded as similar to the pressure and this is detected from the output of a detector, not shown, provided on the lock chamber 103, the gate valve facing the inside of the vacuum-side sample transfer chamber 104 on the rear side (the loading side) of the vacuum processing apparatus 100 is opened, and the arm of the transfer robot disposed in the vacuum transfer chamber in the inside of the vacuum-side sample transfer chamber 104 extends to place the sample housed in the lock chamber 103 on the arm end portion, and unloads the sample to the vacuum transfer chamber. The transfer robot that contracts the arm turns, vertically rotating about its axis in the vacuum transfer chamber, the transfer robot extends the arm from the position opposite to any of the intermediate chamber 105 or the processing units 106 to 109 that is a predetermined target place before the sample is unloaded from the sample housing cassette, and enters and loads the sample placed at the arm end portion to the target place. Similarly to the unprocessed sample loaded in the lock chamber 103, the unprocessed sample transferred to the intermediate chamber 105 is transferred to any of the processing units 108 and 109 that is a predetermined target place by the transfer robot disposed in the vacuum transfer chamber in the inside of the vacuum-side sample transfer chamber 104'.

The sample loaded in the target processing chamber in the inside of the vacuum container of the processing unit is subjected to processing, such as etching, on the process target film layer disposed on the surface of the sample in the processing chamber under the predetermined conditions, and then the sample is transferred and returned to the lock chamber 103 on the backward passage. When the processed sample is loaded in the lock chamber 103, the gate valve facing the vacuum transfer chamber in the vacuum-side sample transfer chamber 104 of the lock chamber 103 is opened and communicated with the vacuum transfer chamber. After the sample is held on the sample stage or the rack in the inside, the arm of the transfer robot is retracted, the gate valve is closed, and the housing space in the lock chamber 103 is hermetically closed. After a noble gas, such as nitrogen, is supplied into the housing space by a gas supply device and the pressure in the inside is increased to the atmospheric pressure or an approximate pressure regarded as similar to the value, the gate valve on the atmosphere-side sample transfer chamber 102 side is opened, the processed sample accommodated in the lock chamber 103 is returned to the original position in the housing space in the inside of the original sample housing cassette by the transfer robot in the inside of the atmosphere-side sample transfer chamber 102.

In the description above, the operation of the vacuum processing apparatus 100 is described in the case in which the sample is transferred to one processing unit for processing. The case is also feasible in which the sample is in turn transferred to a plurality of processing units for processing depending on the conditions of the process step of processing applied to the sample, or the case is also feasible in which the sample is transferred to at least one of the processing units 106 to 108 to apply etching on the sample and the sample is transferred to the processing unit 109 for asking. Etching on the sample performed in the processing units 106 to 108 may be performed on one film layer under one condition, or a plurality of process steps may be performed on one film layer or a plurality of film layers under a plurality of conditions.

Figure 2:
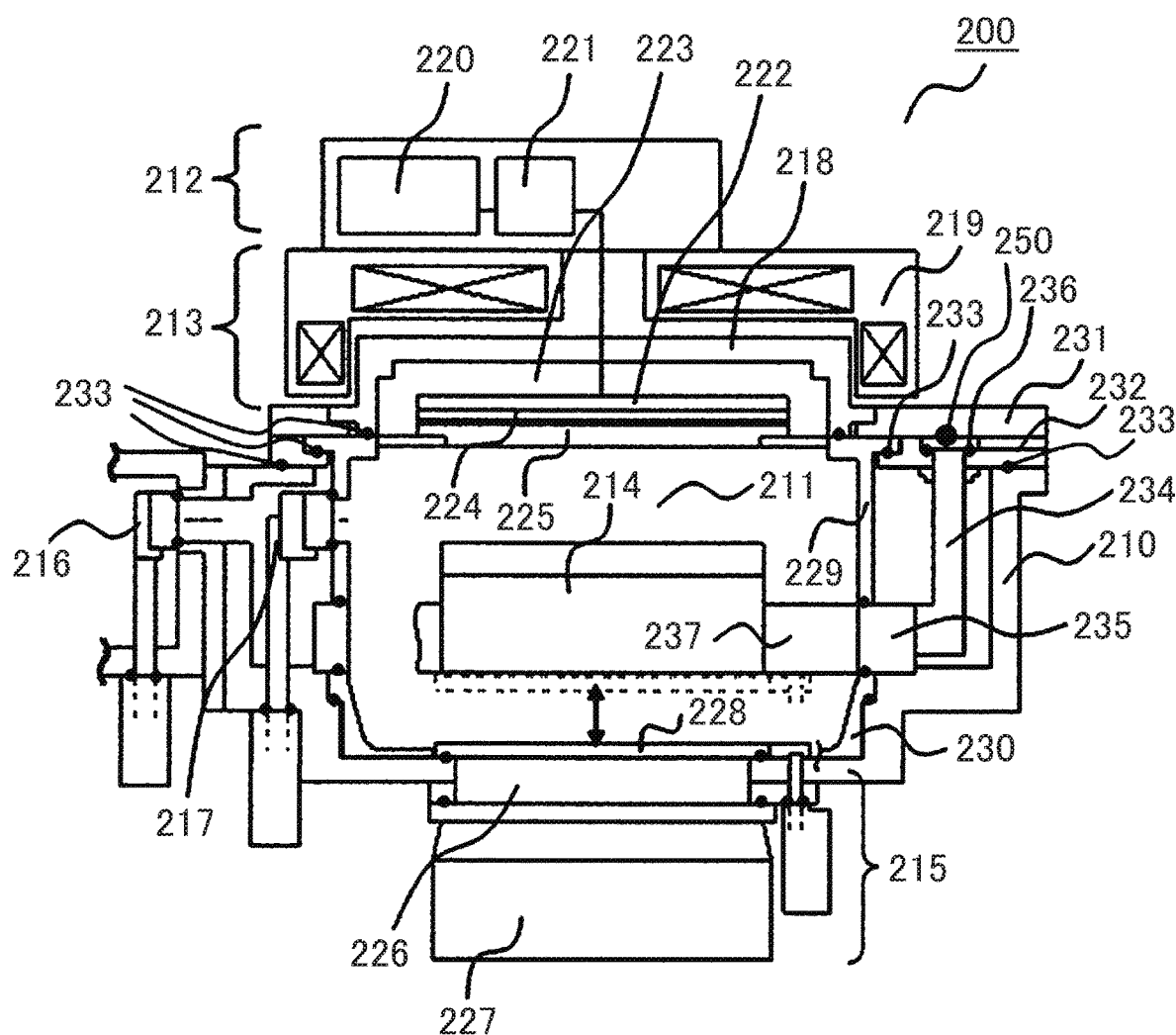
FIG. 2 is a longitudinal sectional view schematically showing the outline of the configuration of the processing unit of the vacuum processing apparatus according to the embodiment shown in FIG. 1.

Next, the processing unit 106 that is one of the vacuum processing units 106 to 108 of the vacuum processing apparatus 100 according to the embodiment shown in FIG. 1 will be described with reference to FIG. 2. FIG. 2 is a longitudinal sectional view schematically showing the outline of the configuration of the processing unit of the vacuum processing apparatus according to the embodiment shown in FIG. 1. Specifically in FIG. 2, the configurations of the vacuum container and the components around the vacuum container are shown in an enlarged view.

The processing unit 106 shown in FIG. 2, roughly separated into the upper part and the lower part, includes a vacuum container unit 200 disposed on the upper part and a bed unit (not shown) in a rectangular shape disposed in the lower part and having a stand that supports the vacuum container unit. FIG. 2 shows the vacuum container unit 200 in the upper part/above in an enlarged view, showing the main components of the vacuum container unit 200. In the inside of a vacuum chamber 210 configuring the vacuum container, a processing chamber 211 is disposed in the inside space of which plasma is formed.

Above the processing chamber 211, an electric field source unit 212 and a discharge unit 213 are disposed. The electric field source unit 212 includes an electric field generator that forms electric fields to be introduced for forming plasma in the inside of the processing chamber 211. The discharge unit 213 includes an antenna member to which electric power of the electric field formed in the electric field source unit 212 is propagated and supplied and a magnetic field generator that excites a process gas introduced into the processing chamber 211 with an interaction with the electric field and used for processing the sample and generates plasma. Note that the discharge unit 213 according to the embodiment includes a cover member configuring the upper part of the vacuum chamber 210 together with the antenna member, and the cover member hermetically seals the processing chamber 211 from the atmosphere at the atmospheric pressure in the outside. Below the discharge space of the processing chamber 211 where plasma is formed, a sample stage 214 in a cylindrical shape is disposed. On the top face of the sample stage 214, a substrate-like sample, such as a semiconductor wafer, is placed.

Below the vacuum chamber 210, an evacuation unit 215 is disposed. The evacuation unit 215 includes a vacuum pump 227, such as a turbo molecular pump, coupled to a member on the bottom face of the vacuum chamber 210 and communicated with the processing chamber 211. By the operation of the evacuation unit 215, plasma or particles, such as reaction products in the processing chamber 211 are emitted to the outside of the processing chamber 211 through an evacuation opening disposed right below the sample stage 214, and the pressure in the inside of the processing chamber 211 is reduced. In the inside of the bed unit located below the vacuum container unit 200 and having a plurality of support poles supporting the bed unit connected to the upper part of the top face, a power supply that supplies electric power to the vacuum container unit 200 and a controller that adjusts the supply of the electric power, and fluids, such as processing gases, coolants for cooling, manipulation air, are disposed.

In FIG. 2, the left end part of the vacuum chamber 210 in FIG. 2 is connected to the vacuum-side sample transfer chamber 104. In the vacuum transfer chamber in the inside of the vacuum-side sample transfer chamber 104 according to the embodiment, a gate valve 216 is disposed. The gate valve 216 opens and closes the vacuum transfer chamber side end portion of the gate that is a sample passage communicated between the processing chamber 211 and the vacuum transfer chamber. In the inside of the vacuum chamber 210, a process gate valve 217 that is another gate valve is disposed. The sample is transferred into the processing chamber 211 with both of the gate valve 216 and the process gate valve 217 opened, and the sample is delivered on the sample stage 214. The processing of the sample is started with the inside of the processing chamber 211 hermetically closed by the process gate valve 217.

The discharge unit 213 disposed on the upper part of the processing chamber includes a cover member 218 in a disk or a cylindrical shape configuring the upper part of the vacuum chamber 210 and an antenna member disposed on the processing chamber 211 side of this cover member 218. The discharge unit 213 includes a magnetic field generator 219 having an electromagnetic coil and a yoke disposed above the cover member 218 and the outer circumference side of the outer edge and a top face member disposed below the antenna member and configuring the ceiling face of the processing chamber 211.

Above the cover member 218, the electric field source unit 212 including a radio frequency power supply 220 that forms electric fields at a radio frequency of the VHF band supplied to the antenna member and a matching unit 221 is disposed, electrically connected to the antenna member. The antenna member includes an antenna 222 in a disk shape and a dielectric member 223. The antenna 222 is configured of a metal conductive member, such as SUS, and disposed on the processing chamber 211 side of the cover member 218. The dielectric member 223 is disposed between the antenna 222 and the cover member 218, and insulates the antenna 222 from the cover member 218. The dielectric member 223 includes a member disposed above the antenna 222 and between the antenna 222 and the cover member 218, and a portion in a ring shape disposed between the antenna 222 and the cover member 218 on the outer circumference side of the antenna 222, through the inside of which electric fields at a radio frequency emitted from the antenna 222 are passed and propagated to the top face member side.

The top face member has a silica plate 224 and a shower plate 225. The silica plate 224 is disposed below the antenna 222 and configured of a dielectric material, such as silica, through which electric fields propagated through the inside of the dielectric member 223 are emitted toward below. The shower plate 225 is disposed below this silica plate 224, has its bottom face facing the processing chamber 221, and has a plurality of gas inlet holes through which a process gas having a mixture of a plurality of kinds of substances to be introduced for processing a sample at a predetermined composition ratio is uniformly dispersed in the inside of the processing chamber 221 and dispersed and introduced in a shower form.

Note that not although not shown in the drawing, the processing units 106 to 108 according to the embodiment each include a gas supply unit including a plurality of gas storage units storing gases having a plurality of substances made up of process gases disposed in the outside of the vacuum container units 220 in the inside, pipes connecting the gas storage units to the vacuum chamber 210, and a regulator (Mass Flow Controller, MFC) that is disposed on the pipe and regulates the flow rate or velocity of the process gas flowing through the pipe. The process gas for processing a sample is introduced into the vacuum chamber 210 through the pipe connected to the cover member 218 by the operation of the gas supply unit, passed through the antenna 222 or a plurality of inlet ports provided on the silica plate 224, and introduced into the space between the top face of the shower plate 225 and the silica plate 224 while being dispersed. Between the silica plate 224 and the shower plate 225, a space, such as a groove, is disposed, the introduced process gas is charged and spread in the space, and then supplied into the processing chamber 221 from above the sample stage 214 through the gas inlet holes of the shower plate 225 at a predetermined flow rate.

In processing the sample, electric fields at a radio frequency from the radio frequency power supply 220 of the electric field source unit 212 are propagated from the antenna member through the top face member and introduced into the processing chamber 211, and magnetic fields formed together at the magnetic field generator 219 are introduced into the processing chamber 221. These electric fields and magnetic fields react to each other to excite, ionize, and dissociate the atoms or molecules of plasma in the processing chamber 211, and then plasma is formed in the processing chamber 211. Using the plasma, the process target film layer on the top face of the sample placed and held on the top face of the sample stage 214 is etched.

On the other hand, on the bottom part of the vacuum chamber 210 below the sample stage 214 according to the embodiment, an opening 226 is disposed facing the processing chamber 211. The evacuation pipe couples the opening 226 to the inlet of the vacuum pump 227, and the processing chamber 221 is communicated with the inlet of the vacuum pump 227, and the evacuation unit 215 is communicated. The evacuation unit 215 includes a vacuum evacuation valve 228 that increases and decreases the passage area of the evacuation pipe disposed on the evacuation pipe to the processing chamber 221 and adjusted the flow rate or velocity of evacuation. The vacuum evacuation valve 228 has a valve including a plurality of flaps having a plate-shaped member through the center of which a shaft crossing the evacuation pipe is passed, and has a function in which the flaps rotate about the axis to adjust the degree of opening the valve by increasing and decreasing the passage area of the pipe and the conductance of evacuation is adjusted. By the operation of cooperating the flow rate and velocity of a process gas introduced from the gas inlet holes of the shower plate 225 and the evacuation unit 215 including the vacuum pump 227, the pressure in the inside of the processing chamber 211 hermetically closed under processing the sample or the transfer of the sample is maintained to a value in a predetermined range.

The configurations of the sample stage 214 and in the inside of the vacuum chamber 210 will be described together with FIG. 3. The vacuum chamber 210 according to the embodiment includes a multi chamber with at least one separate chamber on its inner side. In the embodiment, the vacuum chamber 210 has two chambers, the inner chamber and the outer chamber. That is, on the inner side of the vacuum chamber 210 that is the outer container, inner chambers 229 and 230 are provided. The inner chambers 229 and 230 are divided into two parts and configure containers on the inner side.

The inner chambers 229 and 230 that are containers in a cylindrical shape on the inner side configure an inner side wall surrounding the processing chamber 211, and the sample stage 214 is disposed on the inner side. The process gas introduced in the processing chamber 211, plasma formed using the process gas, and reaction products formed in the processing chamber 211 during the processing of the sample are evacuated from the opening 22 through the space between the outer side wall of the sample stage 214 and the inner side wall of the inner chamber 229 and through the space of the processing chamber 211 surrounded by the inner chamber 230 below the sample stage 214. Note that the space between the wall surface on the inner side of the inner chambers 229 and 230 and the surface of the sample stage 214 is communicated with the space above the sample stage 214 where plasma is formed, the pressure is adjusted to a pressure value at a similar vacuum degree.

The inner chambers 229 and 230 shown in the embodiment are configured of a conductive member, such as a metal, electrically connected to the vacuum chamber 210 that is the outer container electrically connected to a grounded electrode, not shown, with a wire, for example, and the inner chambers 229 and 230 are at a predetermined potential (a ground potential in the embodiment). Thus, the potential of the inner chambers 229 and 230 configuring the inner side wall of the processing chamber 211 on the inner side in contact with plasma formed in the processing chamber 211 and the potential of plasma are maintained at a value in a predetermined range, and the processing of the sample in the processing chamber 211, or the amount of the interaction between plasma particles, the inner chambers 229 and 230, and the sample, and the characteristics are stabilized.

In the embodiment, the inner chamber 229 is configured of a conductive member, such as a metal, and connected to the inner edge part of the opening of a sample stage base plate 231 similarly configured of a conductive member, such as a metal, on the bottom face of a flange part disposed on the upper end portion, and the inner chamber 229 is electrically connected to the vacuum chamber 210 at a ground potential through the sample stage base plate 231. Similarly, the inner chamber 230 is configured of a conductive member, such as a metal, the bottom face or the bottom face of the flange part on the upper end portion is in contact with the inner wall surface of the bottom part of the vacuum chamber 210, and the inner chamber 230 is electrically connected to the vacuum chamber 210.

The discharge unit 213 disposed above the cover member 218 on the upper part of the vacuum chamber 210 includes a discharge base plate 231 that is a plate-shaped member in contact with a member disposed above. The discharge base plate 231 is placed on the upper part of the upper end portion of the vacuum chamber 210 in FIG. 2, and applies weight to the vacuum chamber 210 toward below together with the cover member 218, the magnetic field generator 219, and the electric field source unit 212 above.

That is, the outer edge part of the flange part disposed on the lower end portion of the cover member 218, disposed in a ring shape surrounding the inner side, and extending to the outer circumference side is fit to the inner side of the step part surrounding along a ring shape on the upper part of the inner edge of the opening of the center part of the discharge base plate 231. The bottom face of the outer edge part of the flange part contacts the bottom face of the step part with a sealing member 233, such as an O-ring, sandwiched, and hence the cover member 218 is positioned above the discharge base plate 231. In the contact state with the components, the inside space of the processing chamber 211 where the pressure in the inside is reduced is hermetically partitioned from the atmosphere in the outside the vacuum processing apparatus 100 by the operation of the sealing member 233, and the downward weight applied to the cover member 218 is also applied to the discharge base plate 231.

The bottom face of the inner edge part of the opening of the discharge base plate 231 contacts the top face of the flange part disposed on the upper end portion of the inner chamber 229 above and extending in the outer circumferential direction. The lower end face of the outer edge part of the cover member 218 contacts the top face of the flange part of the inner chamber 229 with the sealing member 233, such as an O-ring, sandwiched. Thus, the downward force from above applied to the cover member 218 is also applied to the discharge base plate 231, and also applied to the inner chamber 229. In the embodiment, the bottom face of the flange part of the upper end portion of the inner chamber 229 is fit to the inner side of the step part surrounding along a ring shape on the upper part of the inner edge of the opening disposed in the center part of the sample stage base plate 232 coupled to the upper part of penetrating suspension beams 234 (four beams in the embodiment) that suspend and support the sample stage 214, and inserted into the inside of the vacuum chamber 210.

The bottom face of the flange part of the inner chamber 229 contacts the bottom face of the step part of the inner edge of the opening of the sample stage base plate 232 with the sealing member 233, such as an O-ring, sandwiched, and the inner chamber 229 is positioned to the sample stage base plate 232. In the contact state with the components, the inside space of the processing chamber 211 where the pressure in the inside is reduced is hermetically partitioned from the atmosphere in the outside the vacuum processing apparatus 100 by the operation of the sealing member 233, and the downward force applied from the contacting upper members to the inner chamber 229 is also applied to the sample stage base plate 232.

The bottom face of the outer edge part of the sample stage base plate 232 contacts the top face of the upper end portion of the side wall portion of the vacuum chamber 210 with the sealing member 233, such as an O-ring, sandwiched, and the discharge base plate 232 is positioned on the vacuum chamber 210. In the contact state with the components, the inside space of the processing chamber 211 where the pressure in the inside is reduced is hermetically partitioned from the atmosphere in the outside the vacuum processing apparatus 100 by the operation of the sealing member 233, and the downward force from the contacting upper members applied to the sample stage base plate 232 is also applied to the side wall part of the vacuum chamber 210.

With the evacuation of the inside space of the processing chamber 211 and a reduction in the pressure, in the state in which the inner chamber 229 is accommodated in the inside of the vacuum chamber 210, the pressure in the space between the side wall part of the vacuum chamber 210 communicated with the inner chamber 229 is reduced through the gate that is the opening through which the sample disposed on the side wall part of the inner chamber 229 is passed, and the sample stage base plate 232, the discharge base plate 231, and the cover member 218 provided on the vacuum chamber 210 move downward in a micro distance so as to press the side wall part of the vacuum chamber 210 from above, and apply, to the vacuum chamber 210, the force due to the difference between the pressure in the inside of the vacuum chamber 210 and the atmospheric pressure in the outside. In the embodiment, when the discharge base plate 231 is fastened and connected to the sample stage base plate 232 using a bolt, for example, the downward pressing force that presses the inner chamber 229 in contact with the discharge base plate 231 is applied from the bottom face of the peripheral part of the opening of the discharge base plate 231, and the top face of the flange part is disposed penetrating the portion on the opening the outer circumference side of the sample stage base plate 232, disposed on the upper end portion of the suspension beam 234 having an elliptic shape in a cross section, and has a diameter larger than the diameter of the lower portion. The top face of the flange part is applied with the downward pressing force from the discharge base plate 231 through a spherical or an elliptic elastic body 250 disposed sandwiched between the flange part and discharge base plate 231.

With the downward force, the suspension beams 234 move downward in a slight distance to the through holes and the sample stage base plate 232. Thus, a sealing member 236, such as an O-ring, of elasticity disposed and sandwiched between the bottom face of the flange part of the upper end portion of the suspension beam 234 and the sample stage base plate 232 is pressed and deformed, and the space between the inner chamber 229 communicated with the inner side of the sealing member 236 and the vacuum chamber 210 is hermetically partitioned from the atmosphere in the outside of the vacuum container unit 200.

On the other hand, in the state in which the discharge base plate 231 is placed above the vacuum chamber 210 and the vacuum chamber 210 is not closed, the suspension beams 234 are held at the position floating in a slight distance to the top face of the sample stage base plate 232 with the sealing member 236 relatively sandwiched, and vertically displaceable to the through holes.

The effect relates to one suspension beam 234 according to the embodiment and the sample stage base plate 232 and the discharge base plate 231 with which the suspension beam 234 engages. In the embodiment, the other suspension beams 234 exert the similar effect.

The sample that is a processed target passes the gate that is the passage disposed on the side wall part of the inner chamber 229 having a size where the sample is passable, and transferred on the sample stage 214 disposed on the inner side of the inner chambers 229 and 230. The embodiment includes the gate valve that opens and closes the opening of the gate before starting and after finishing the processing of the sample in the processing chamber 211 to communicate the processing chamber 211 in the inside of the inner chamber 229 with the inside space of the vacuum chamber 210 on the outer side and close the communication, and the gate valve that opens and closes the opening at the end portion of the gate disposed at the position at which the vacuum transfer chamber in the inside of the vacuum-side sample transfer chambers 104 and 104' is communicated with the inside of the vacuum chamber 210 to communicate the vacuum transfer chamber in the inside of the vacuum-side sample transfer chambers 104 and 104' with the inside of the vacuum chamber 210 and close the communication in the state in which the vacuum chamber 210 is connected to the vacuum-side sample transfer chamber 104 or 104'. The sample is transferred through these gates.

That is, the embodiment includes the atmospheric gate valve 216 and the process gate valve 217. The atmospheric gate valve 216 is a valve that vertically moves being driven, and opens or hermetically closes the opening at the gate end portion between the vacuum container unit 200 and the vacuum-side sample transfer chamber 104 or 104' to communicate the processing chamber 211 with the vacuum chamber or close the communication. The process gate valve 217 is a valve that is disposed in the space between the inner chamber 229 and the vacuum chamber 210, vertically moves being driven, and opens or hermetically closes the inside and outside of the inner chamber 229 to communicate the inside with the outside of the inner chamber 229 or close the communication. The atmospheric gate valve 216 has a valve body disposed in the inside of the vacuum-side sample transfer chambers 104 and 104' and is vertically driven by a drive disposed below the vacuum container configuring the vacuum-side sample transfer chambers 104 and 104'. After the valve body is elevated to the upper limit position, and the valve body moves horizontally to the side wall on the inner side of the vacuum-side sample transfer chambers 104 and 104', contacts the side wall, and opens and hermetically closes the gate disposed on the side wall.

The process gate valve 217 that opens or hermetically closes the opening of the gate disposed on the side wall of the inner chamber 229 is disposed in the space between the inner chamber 229 and the vacuum chamber 210. After the valve body is vertically driven by a drive disposed below the bottom part of the vacuum chamber 210, and elevated to the upper limit position, the valve body horizontally moves to the side wall of the inner chamber 229 (in the lateral direction in the drawings), and contacts the side wall surface of the inner chamber 229 around the opening of the gate. On the face to which the valve body contacts the side wall, the sealing member, such as an O-ring, is disposed, and the inner side and the outer side of the opening of the gate are hermetically sealed or opened with the valve body pressed.

The inner chamber according to the embodiment includes two members 229 and 230 above and below, and are disposed above and below the sample stage ring base. The inner chamber 229 disposed above a sample stage ring base 235 in a cylindrical shape has a cylindrical shape, and the inner diameter of the inner chamber 229 has a value the same as the diameter of the sample stage ring base 235 or an approximate value regarded as similar to the value.

The sample stage ring base 235 has the inner side wall coupled and connected to the outer side wall of the sample stage 214 in a cylindrical shape having a diameter smaller than the diameter of the sample stage ring base 235 with a plurality of support beams 237 radially disposed about the axis in the center of the sample stage 214 in the vertical direction. The support beams 237 hold the sample stage 214 at the middle position in the vertical direction between the plasma forming (discharge) space in the inside of the processing chamber 211 of the inner chambers 229 and 230 and the gas storage space above the evacuation opening 226. The angle between the radial center axes of the plurality of support beams 237 about the center axis of the sample stage 214 in the vertical direction when viewed from above is the same value or an approximate value regarded as similar to the value. The variation in the flow rate or velocity about the center axis of the sample stage 214 is reduced when the process gas introduced into the processing chamber 211, plasma formed in the processing chamber 211, or the particles of reaction products are dispersed in the space between the support beams 237 and the outer side wall of the sample stage 214 and the inner chamber 229 or the sample stage ring base 235 and flow into the inside space of the inner chamber 230 below.

The inner chamber 230 in a cylindrical shape is fit into a recess of the lower center part of the vacuum chamber 210 and disposed below the sample stage 214, the support beam 235, and the sample stage ring base 235, and the flange part disposed extending on the outer circumference side of the upper end portion is positioned being placed the step part surrounding the recess in a ring shape at the upper end portion of the inner edge of the recess. The opening 226 in a circular shape that is the center side portion of the inner chamber 230 and disposed right below the sample stage 214 is communicated with the evacuation unit including the vacuum evacuation valve 228 and the vacuum pump 227, and configures the evacuation passage through which particles of a gas, for example, flowing around the sample stage 214 and entering the processing chamber 211, are passed and emitted to the outside of the processing chamber 211.

Figure 3:
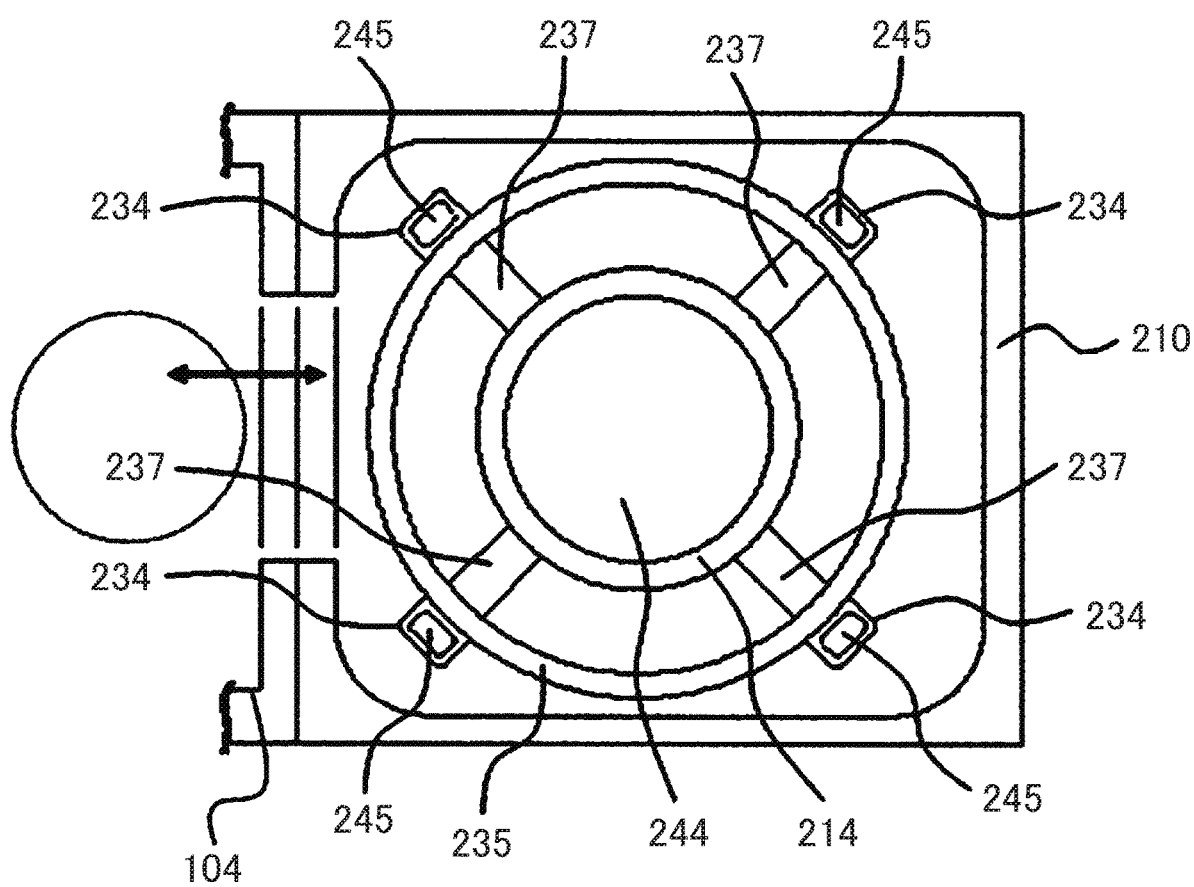
FIG. 3 is a transverse sectional view showing the outline of the configuration of the vacuum container unit and the sample stage of the vacuum processing unit according to the embodiment shown in FIG. 2.

FIG. 3 shows the disposition of the support beams. FIG. 3 is a transverse sectional view showing the outline of the configuration of the vacuum container unit and the sample stage of the vacuum processing unit according to the embodiment shown in FIG. 2. FIG. 3 shows the cross section of the middle height position of the support beams in the vertical direction in FIG. 2.

When viewed from above, the vacuum chamber 210 has a rectangular cross section in the horizontal direction or an approximate shape regarded as similar to the rectangular cross section. In the inside of the vacuum chamber 210, a sample stage module is disposed including the sample stage 214, the suspension beams 234, the sample stage ring base 235, and the support beams 237. Four suspension beams 234 are connected to the outer side wall of the sample stage ring base 235 on the outer side. The space between two suspension beams 234 configures a space in which the sample is transferred between the upper area on the top face of the sample stage 214 and the vacuum transfer chamber passing the gate that is the sample passage communicates the vacuum chamber 210 with the vacuum transfer chamber in the vacuum-side sample transfer chamber 104 along the direction of arrows in FIG. 3.

As shown in FIG. 3, in the space in a nearly rectangular space on the inner side of the vacuum chamber 210 according to the embodiment, i.e., on the inner side of the space between the vacuum chamber 210 and the inner chamber 229 or 230, the sample stage ring base 235 having the inner wall surface in a cylindrical shape is disposed. As also shown in FIG. 2, the sample stage ring base 235 is disposed between the inner chambers 229 and 230 sandwiching the sealing member 233, and configures the processing chamber 211 together with the support beam 237. On the outer circumference side of the sample stage ring base 235, the suspension beams 234 is disposed being connected to the sample stage ring base 235 at radial positions similar to the end portions of the support beams 237 on the outer side to the center axis of the sample stage 214 in the vertical direction.

In FIG. 3, in the inside of the sample stage 214 in a cylindrical shape, a housing space 244, described later, is disposed, and coupled to and communicated with ducts 245 disposed in the inside of four suspension beams 234 through a passage disposed in the inside of each of the suspension beams 234. Four support beams 237 are radially disposed spaced at equal angles at approximate angles regarded as similar to the equal angles about the center axis of the sample stage 214 in the vertical direction when viewed from above.

The space between the support beams 237 that is the space between the sample stage 214 and the sample stage ring base 235 is the portion where gas, plasma, and particles, such as products, in the processing chamber 211 above the sample stage 214 flow and flow in the lower space of the processing chamber 211 for gas storage on the inner side of the inner chamber 230 below the sample stage 214. The support beams 237 are disposed at the same angles or nearly the same angles as the exes in the radial direction are disposed about the center axis of the sample stage 214 in the vertical direction. The length of the evacuation passage passing between the support beams 237 through which particles flow from the center of the top face of the sample stage 214 to the opening 226 is configured such that variation is small about the center axis and the shape of the space between the support beams 237 configuring the evacuation passage is the same shape or an approximate shape regarded as similar to the shape when viewed from above the axis. Thus, in the space of the processing chamber 211 above the sample held on the sample stage 214 for processing, the variation in the distribution of particles in plasma is reduced about the center axis, and as a processed result, the variation in the processed shape is restrained.

Figure 4:
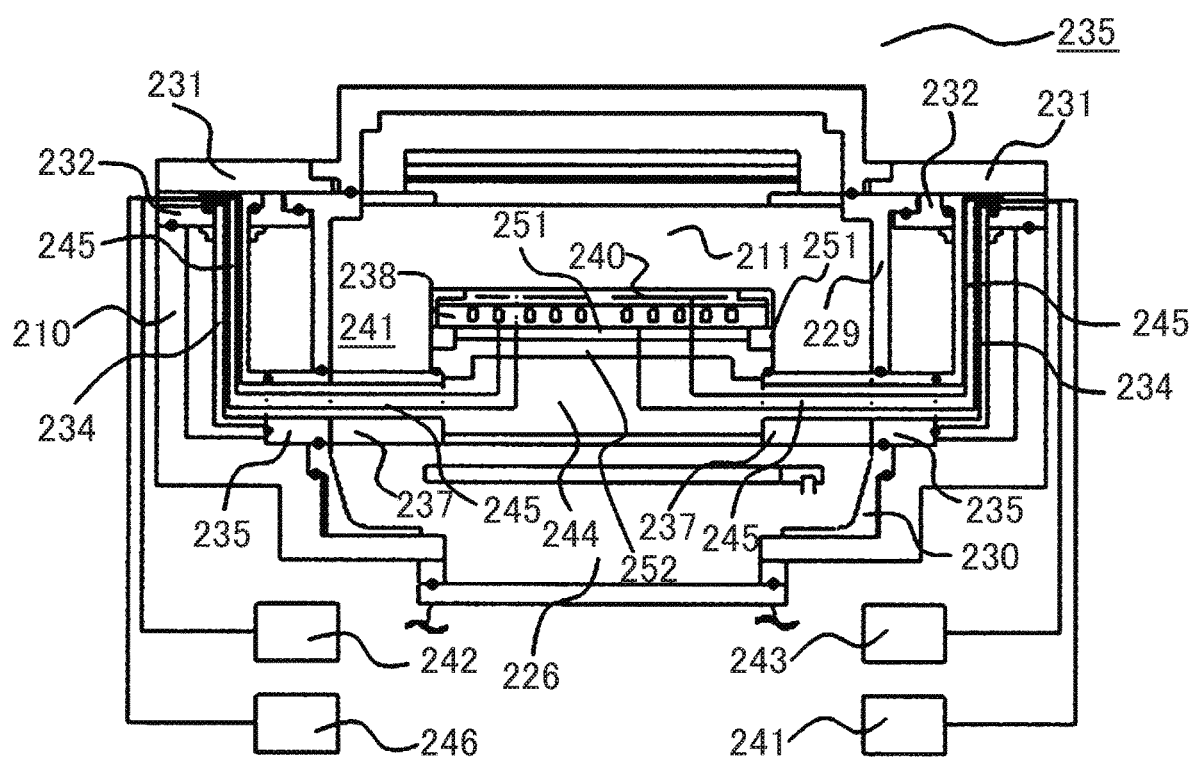
FIG. 4 is an enlarged longitudinal sectional view showing the outline of the configuration of the vacuum container unit and the sample stage of the vacuum processing unit and neighboring components according to the embodiment shown in FIG. 2.

Referring to FIG. 4, the portion including the sample stage 214 of the vacuum container unit 200 will be described more in detail. FIG. 4 is an enlarged longitudinal sectional view showing the outline of the configuration of the vacuum container unit and the sample stage of the vacuum processing unit and neighboring components according to the embodiment shown in FIG. 2.

The sample stage 214 shown in the embodiment includes a base material 238 that is a metal disk of a high heat conductivity with a disk shape in the inside of the sample stage, a dielectric film 239 disposed above the top face in this circular shape covering the top face and formed of a dielectric material of a mixed material having alumina or yttria as a principal component, and a film-shaped electrode 240 disposed in the inside of the dielectric film. To this electrode, a direct current power supply 241 placed on the outside of the vacuum chamber applies a direct current voltage through a filter circuit (not shown). With this direct current voltage, Coulomb force is worked between the electrode and the sample placed on the sample stage placement face through the dielectric film to electrostatically chuck the sample.

In the embodiment, a passage in a concentric circle or spiral shape is included in the inside of the base material 238, and a heat exchange medium, such as a coolant, whose temperature and flow rate (velocity) are adjusted at a temperature regulation unit 246 placed in the outside of the vacuum chamber 210 is supplied to the inside passage through piping connecting these components and circulated along the passage. These components configure a sample stage temperature regulation system connected to the sample stage 214, operated corresponding to instruction signals from a controller, not shown, and the temperature of the base material 238 and the temperature of the sample stage 214 are adjusted to a desired temperature. In the embodiment, one system of circulation line is provided on the sample stage temperature regulation system. However, a configuration may be provided in which a plurality of passages is formed in the inside of the base material 238, a plurality of temperature regulation units individually coupled supplies and circulates a coolant at a temperature in a predetermined range, and the temperature profile of the sample or the temperature profile of the sample in the radial direction from the center of the top face of the dielectric film 239 is achieved.

As described above, the sample stage 214 includes an electrostatic chuck device, an ion energy controller, a sample stage temperature regulation system, and a heat transfer gas supply system. The electrostatic chuck device electrostatically chucks the sample to the top face of the dielectric film 239 configuring the top face of the sample stage 214 and improves the performance of controlling the temperature of the sample. The ion energy controller induces charged particles, such as ions, in plasma using the potential difference between the bias potential formed by radio frequency electric power and the potential of plasma for collision, adjusts ion energy to promote processing in a specific direction, and improves anisotropy. The sample stage temperature regulation system adjusts the temperature of the sample by heat exchange with the heat exchange medium at a predetermined temperature circulated in the inside of the base material 238. The heat transfer gas supply system supplies a heat transfer gas between the back face of the sample and the top face of the dielectric film 239 at a predetermined pressure or a flow rate in order to improve heat transfer between the sample and the base material 238. The sample placed on the top face of the dielectric film 239 is heated due to heat from plasma in processing using plasma. However, the heat exchange medium is circulated in the passage, and heat transfer is performed with the base material 238 having a temperature adjusted is a preferable range through the dielectric film 239. Thus, the temperature of the sample is adjusted to a value in a range suited to processing. The sample that is a processed target is electrostatically chucked and held entirely on the top face of the dielectric film 239. Thus, the heat transfer between the dielectric film 239 and the sample is improved, the temperature of the sample is achieved to highly accurately set to a value in a range suited to processing, and the variation in the temperature can be reduced.

In the embodiment, the heat transfer gas supply system is used in order to improve the heat transfer between the sample and the base material 238. Through the heat transfer gas supply system coupled to the sample stage 214, a gas of heat conductivity, He gas, for example, adjusted at a predetermined pressure or a predetermined flow rate is supplied between the dielectric film 239 and the sample electrostatically chucked and held on the dielectric film 239, and hence the temperature of the sample is adjusted in a desired range. The heat transfer gas supply system includes a gas source, not shown, including a gas storage of a gas of heat conductivity, and a heat transfer gas flow rate regulator 242 disposed on pipes connecting a plurality of through holes disposed penetrating the metal base material 238 and the dielectric film 239 on the base material 238 to the metal base material 238 and the dielectric film 239 and on a pipe in the outside of the pipe and the processing chamber 211, the heat transfer gas flow rate regulator 242 adjusting a flow rate or pressure of a heat transfer gas supplied circulating the pipe. The end portion of the top face of the dielectric film 239 of the through holes of the heat transfer gas supply system configures the gas inlet port of the heat transfer gas. The heat transfer gas from the gas source is supplied, from a plurality of gas inlet ports, to the space between the back face of the sample held in contact with a plurality of projecting top faces disposed on the top face of the dielectric film 239 and the surface of the dielectric film 239 except the plurality of projecting top faces in adjustment by the operation of the heat transfer gas flow rate regulator 242.

In the embodiment, the base material 238 of the sample stage 214 is electrically connected to a radio frequency power supply 243 placed in the outside of the vacuum chamber through a matching unit, not shown. From the radio frequency power supply 243, radio frequency electric power at a frequency different from the frequency of radio frequency electric power for plasma generation is supplied to the base material 238 through the matching unit. The base material 238 and the dielectric film 239 form a bias potential on the top face of the sample. In the embodiment, for the radio frequency electric power supplied from the radio frequency power supply 243, radio frequency electric power in the RF frequency band, at a frequency of 4 MHz, for example, is used. With the supply of the radio frequency electric power, charged particles, such as ions, in plasma are induced on the top face of the sample for collision on the process target film layer on the top face of the sample, corresponding to the difference between the potential formed above the top face of the sample and the potential of plasma, and anisotropic etching is achieved using an ion assist reaction.

In the lower part of the base material 238, a metal plate member 252 is disposed with an insulating member 251 sandwiched, and the plate member 252 is fastened with a bolt, screw, and any other component, not shown, and integrally connected. The outer edges of the insulating member 251 and the plate member 252 are in a circular shape with the same diameter as the diameter of the base material 238 above, and concentrically disposed with the base material 238 with the insulating member 251 and the plate member 252 coupled. The plate member 252 is fastened to the upper end portion of the side wall of the base portion in a cylindrical shape to which four support beams 237 are connected and concentrically disposed with the sample stage 214 with the sealing member, such as an O-ring, sandwiched between them and integrally coupled with a bolt, screw, and any other component. The base material 238 having the insulating member 251 and the dielectric film 239 is coupled to the plate member 252 coupled to the base portion of the sample stage 214, and hence the housing space 244 in the inside of the sample stage 211 is partitioned being hermetically sealed from the inside of the processing chamber 211 in the outside.

The housing space 244 is communicated with the atmosphere in the outside of the vacuum chamber 210 through the passage in the inside of the support beams 237 and through the ducts 245 disposed penetrating the inside of each of the suspension beams 234 disposed on the outer circumference side with the sample stage ring base 235 of the support beams 237 sandwiched and communicated with the passages in the inside of the support beams 237. The pressure in the inside of the housing space 244 has a value slightly higher than the value of the atmosphere.

The housing space 244 is a space having at least one cylindrical shape. In the embodiment, the center axis of the cylinder is disposed at a position matched with the center axis of the sample stage 214 in the vertical direction or an approximate position regarded as similar to the position. In the housing space 244, the ducts in the inside of each of the suspension beams 234, and the passage in the inside of the support beam 234 communicating these components, the following is disposed: a pipe, such as piping, formed of a part of the sample stage temperature regulation system, and as a medium passage through which the heat exchange medium from the temperature regulation unit 246 is supplied and discharged to the passage disposed in the inside of the base material 238; a cable formed of a part of the ion energy controller as a passage to supply bias potential forming radio frequency electric power to be supplied to the base material 238 and a connector connected to the cable; a cable as a passage to supply direct current power to the electrode 240 of the electrostatic chuck device for electrostatically chuck disposed in the inside of the dielectric film 239 and a connector connected to the cable; and a pipe, such as piping, formed of a part of the heat transfer gas supply system, as a passage communicated with a plurality of gas inlet ports on the top face of the dielectric film 239 through which a gas of heat conductivity is circulated.

One end of the passage of each of the support beams 237 is communicated with the opening disposed on the inner side wall of the base portion of the sample stage 214 configuring the housing space 244. Through these openings, the piping disposed on the ducts 245 through which the heat exchange medium or the heat transfer gas is circulated and the cable through which radio frequency electric power or direct current voltage is supplied and the connector are connected or coupled to the base material 238 with the metal plate member 252 configuring the ceiling face of the housing space 244 sandwiched. The other end of the passage of the support beam 237 penetrates the sample stage ring base 235, and communicates with the lower end portion of the duct 245 in the inside of each of the suspension beams 234. The upper end portion of each of the ducts 245 is disposed at the upper end portion of each of the suspension beam 234 located above the top face of the sample stage base plate 232, communicated with the opening, and communicated with the atmosphere in the outside of the vacuum processing apparatus 100.

In other words, the pipes disposed in the housing space 244 for the sample stage temperature regulation system and the heat transfer gas supply system through the duct 245 and the cables and wires for the electrostatic chuck device and the ion energy controller are coupled to the direct current power supply 241, the heat transfer gas flow rate regulator 242, the radio frequency power supply 243, and the temperature regulation unit 246 provided on the outside of the vacuum chamber 210, e.g. a bed unit, and the base material 238 and the dielectric film 239 integrally joined to the base material 238, and a gas and electric power are introduced into the sample stage 214. The ducts 245 communicating the atmosphere with the housing space 244 at an atmospheric pressure or at an approximate pressure to the atmospheric pressure are also hermetically sealed between the outside and the inside using the seal unit, such as an O-ring, and the spaces in the inside of the processing chamber 211 and the vacuum chamber 210 to be reduced in pressure are hermetically partitioned.

Figure 5A:
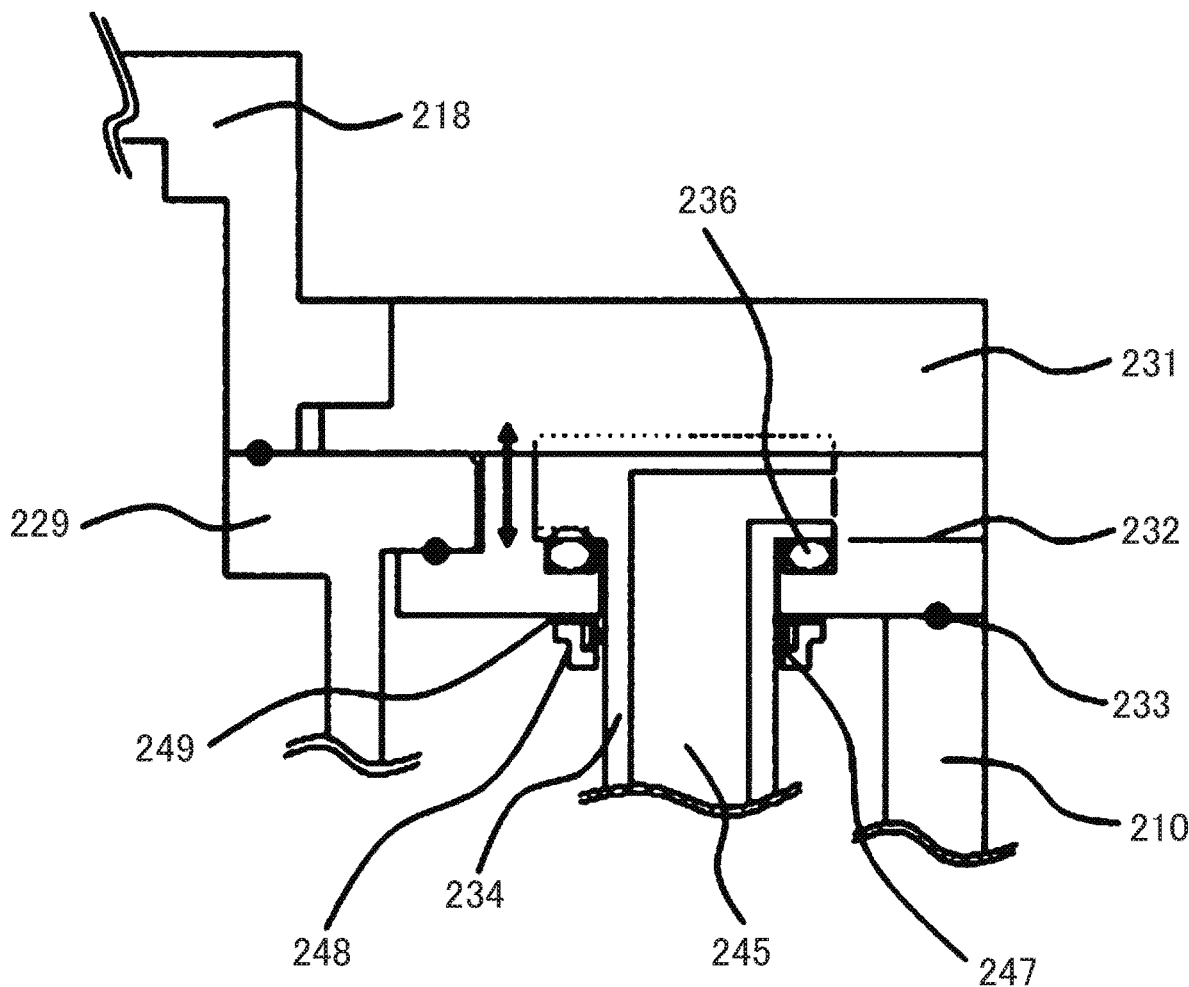
FIG. 5A is an enlarged longitudinal sectional view showing the outline of the configuration of the suspension beam of the vacuum container unit according to the embodiment shown in FIG. 3.
Figure 5B:
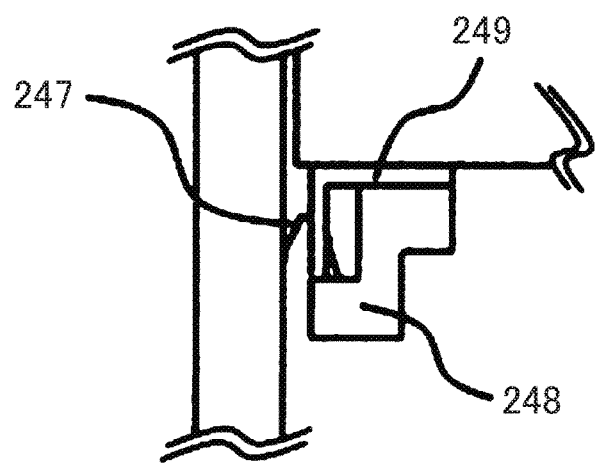
FIG. 5B is an enlarged longitudinal sectional view showing the outline of the configuration of the suspension beam of the vacuum container unit according to the embodiment shown in FIG. 3.

Referring to FIGS. 5A and 5B, the configuration of the upper part of the suspension beam 234 according to the embodiment will be described more in detail. FIGS. 5A and 5B are enlarged longitudinal sectional views showing the outline of the configuration of the suspension beam of the vacuum container unit according to the embodiment shown in FIG. 3.

In the embodiment, the sample stage ring base 235 configures the inner wall surface of the processing chamber 211 together with the inner chambers 229 and 230 disposed above and below. The sample stage ring base 235 faces plasma formed above the sample stage 211, and is a member surrounding the passage through which particles, a gas, and reaction products in plasma flow. Thus, the inner chambers 229 and 230 are connected through the sample stage base plate 232 or placed on the vacuum chamber 210, and have the same potential as the vacuum chamber 210 at a ground potential.

On the other hand, similarly to the inner chambers 229 and 230, the sample stage ring base 235 is also electrically connected to the vacuum chamber 210 through the sample stage base plate 232 and the suspension beams 234 disposed penetrating the sample stage base plate 232, and has a ground potential. Thus, a conductive connector 247 is provided. The conductive connector 247 is disposed on the sample stage base plate 232 at a place where the suspension beam 234 penetrates the inner side, and configured of a member of excellent conductivity, such as a metal, and the conductive connector 247 electrically connects the sample stage base plate 232 to the suspension beam 234.

As shown in FIG. 5A, when the outside and the inside of the vacuum chamber 210 are hermetically partitioned, a downward pressing force is applied to the sample stage base plate 232 through the flange part of the inner chamber 229 in contact with the bottom face of the inner edge part of the opening in the center part of the discharge base plate 231 on which the cover member 218 is placed and the top face of the recess of the inner edge part on which the bottom face of the flange part is placed from the flange part. The bottom face of the outer edge part of the sample stage base plate 232 applied with the pressing force is slightly displaced downward, and connected to the top face of the upper end portion of the side wall of the vacuum chamber 210 oppositely disposed with the sealing member 233, such as an O-ring, sandwiched, and then the pressing force is applied to the upper end portion of the side wall of the vacuum chamber 210. Note that the pressing force going downward also includes force applied corresponding to the difference between the pressure in the inside of the processing chamber 211 or the vacuum chamber 211 where the pressure is reduced and the atmospheric pressure around the vacuum container unit 200 (the atmospheric pressure or a pressure at an approximate value to the atmospheric pressure).

Around the opening of the center part of the sample stage base plate 232, through holes through which the suspension beam 234 is penetrated and fit are disposed at four places. In the state in which the outside and the inside of the vacuum chamber 210 are hermetically partitioned, the upper part of each of the suspension beams 234 is disposed sandwiched between the sample stage base plate 232 and the discharge base plate 231 placed on the sample stage base plate 232 and the flange part of the inner chamber 229 covering them. In this state, in the flange part having a diameter larger than the diameter of the lower part of the upper end portion of each of the suspension beams 234 and extending to the outer circumference side, the top face is applied with a downward pressing force from the bottom face of the discharge base plate 231. The suspension beams 234 are moved in a slight distance downward to the sample stage base plate 232, the sealing member 236, such as an O-ring, sandwiched between the bottom face of the flange part and the sample stage base plate 232 and the top face of the outer circumference side portion of each of the through holes is pressed downward and deformed, and hence the space between the inside of the vacuum chamber 210 below the bottom face of the sample stage base plate 232 and the outer side of the sealing member 236 on the top face of the sample stage base plate 232 is hermetically sealed.

That is, the suspension beam 234 in the state in which the outside and the inside of the vacuum chamber 210 are hermetically partitioned sandwiches the sealing member 236 of elasticity between the flange part and the top face of the sample stage base plate 232. The sealing member 236 is turned into the state in which the sealing member 236 is not deformed or deformed in a degree in which the sealing member 236 does not exert the performance of hermetical sealing. The suspension beam 234 is held displaceable in the through holes in the direction depicted by arrows to the sample stage base plate 232. On the other hand, the sealing member 236 is pressed downward and crushed due to the pressing force, from the discharge base plate 231, including the pressure difference from the atmospheric pressure when the pressure in the inside of the vacuum chamber 210 or the processing chamber 211 is reduced, and the sealing member 236 can hold hermetical seal between the atmosphere and the space between the vacuum chamber 210 and the inner chamber 229.

In FIGS. 5A and 5B, the elastic body 250 shown in FIG. 2 is omitted between the flange part on the upper part of the suspension beam 234 and the discharge base plate 231. However, the flange part on the upper part of the suspension beam 234 may be applied with the pressing force from the discharge base plate 231 with the elastic body 250 sandwiched, or the flange part on the upper part of the suspension beam 234 and the discharge base plate 231 may be applied with the pressing force in direct contact with each other. The displacement in the vertical direction of the suspension beam 234 takes place due to not only an increase and decrease in the pressure in the inside of the processing chamber 211 or the vacuum chamber 210 but also the expansion or the displacement of members configuring the inner wall surface of the processing chamber 211 caused by the temperature of the sample stage 214 or the inner chambers 229 and 230 and the sample stage ring base 235 applied with heat from plasma during the processing of the sample.

The suspension beams 234 are disposed penetrating four openings disposed around the opening in the center part of the sample stage base plate 232 on which the inner chamber 229 is placed with a spacing between the outer side wall of the suspension beam 234 and the inner side wall of the through holes of the sample stage base plate 232. The outer side wall of the suspension beam 234 is configured of a member of excellent conductivity, such as a metal, and electrically connected to the sample stage base plate 232 electrically connected to the vacuum chamber 210 with the conductive connector 247 sandwiched.

The conductive connector 247 according to the embodiment is formed in which a plate or line-shaped member of excellent conductivity, such as a metal, is bent at a place between the two ends, a clip-shaped portion in a V-shaped longitudinal section is coupled and connected in a ring shape in the lateral direction. One end portion of the V-part of the clip-shaped portions is disposed in contact with the outer side wall of the suspension beam 234 along the outer side wall. The other end portion of the V-part of the clip-shaped portions is held being sandwiched between retainers 248 and 249 disposed in a ring shape along the inner edge of the through holes on the bottom face of the sample stage base plate 232. Specifically, at the V-shaped other end portions, in the state in which the longitudinal section connected to the bottom face of the sample stage base plate 232 is fit into the shaped retainer 249, the retainers 248 and 249 are connected to each other with a screw, for example, with the other end portion sandwiched between the retainer 248 and the retainer 249, and hence the conductive connector 247 is positioned to the retainers 248 and 249 and fixed.

In the state in which the retainer 248 or 249 is attached and electrically connected to the bottom face of the sample stage base plate 232 surrounding the outer edge along the outer edge of the through hole, one V-shaped end portion of the conductive connector 247 when viewed from above is located at a place protruding on the inner side beyond the outer edge of the through hole. In the state in which the suspension beam 234 is inserted into the through holes, one V-shaped end of the conductive connector 247 is disposed such that the one V-shaped end slidably contacts the metal outer side wall of the suspension beam 234. Thus, after the inside of the vacuum chamber 210 is reduced in pressure and the outside and the inside of the vacuum container unit 200 are hermetically sealed or the pressure in the inside of the vacuum chamber 210 is turned to the atmospheric pressure or an approximate pressure regarded as similar to the atmospheric pressure, even though the suspension beam 234 moves in a micro distance in the vertical direction when the discharge base plate 231 is elevated above and the inside is opened to the atmosphere, the contact and electrical connection to the conductive connector 247 and the outer side wall of the suspension beam 234 are maintained following the movement in the micro distance.

In the embodiment, the clip-shaped portions of the conductive connector 247 are formed in an inverted V-shape in the vertical direction, one V-shaped end portion has a cross section in which the cross section is bent in a projecting shape to the outer side wall of the suspension beam 234, and is bent on the outer circumference side (the far side) of the outer side wall. The clip-shaped portion contacts the outer side wall of the suspension beam 234 at the place where the cross section of the conductive connector 247 has the curved surface in a projecting shape, and hence relative slides of the clip-shaped portions are easily achieved. With surface contact, a relatively large contact area is surely provided in the slides, and electrical connection between the suspension beam 234 and the sample stage base plate 232 of the sample stage ring base 235 or the vacuum chamber 210 is maintained.

In the embodiment, the discharge unit 213 including the cover member 218, the inner chambers 229 and 230, the discharge base plate 231, the sample stage base plate 232, the suspension beam 234, the sample stage ring base 235, the conductive connector 247, and the retainers 248 and 249 are configured of a member of excellent conductivity, electrically connected to the vacuum chamber 210, and are at a predetermined potential. In the embodiment, the potential is at the ground potential. The outer side wall of the suspension beam 234 is exposed to the particles of a reaction product or gas floating from the inside of the processing chamber 211 to the outside of the inner chamber 229 when the process gate valve 217 is opened. After these particles or products generated due to the interaction to the particles due to corrosion, for example, these particles and the products might be again attached to the sample to be transferred. Thus, in the embodiment, for the outer side wall of the suspension beam 234, a member configured of a metal of high corrosion resistance, such as SUS or titanium. Therefore, corrosion resistance is improved as well as abrasion due to slides is reduced.

As described above, according to the embodiment, the variation in the circumferential direction of the sample stage 214, such as the amount of flow or the velocity of particles of plasma in the processing chamber 211 from the upper part of the top face of the sample stage 214 to the opening 226 below the sample stage 214 and the variation in the circumferential direction in the processing of the sample are reduced, and hence stable processing is achieved. The reliability, such as the corrosion resistance or the lifetime of the inside of the vacuum chamber 210 is improved, and a reduction in reproducibility and the difference in the performance of the processing of the sample or the processed result among the plasma processing apparatuses can be restrained for a long time.

What is claimed is:

1. A plasma processing apparatus comprising:
   a vacuum chamber that is grounded, the vacuum chamber configuring a vacuum container and a cover member disposed on an upper part of the vacuum chamber;
   an inner chamber disposed in the vacuum chamber, the inner chamber having an inner chamber to which a processing gas is supplied to form plasma, the inner chamber being detachable from the vacuum chamber;
   a sample stage disposed at a center part in the inner chamber, the sample stage on which a wafer is placed on a top face of the sample stage;
   an evacuation opening disposed on a center part of a bottom part of the inner chamber below the sample stage, the evacuation opening through which an inside of the inner chamber is evacuated;
   a vacuum pump disposed below the sample stage below the vacuum chamber, the vacuum pump being configured to communicate with the evacuation opening to evacuate the inside of the inner chamber;
   a sample stage ring base disposed in the inner chamber, the sample stage ring base being disposed in a ring shape around below the sample stage, the sample stage ring base being coupled to the sample stage through a support beam horizontally extending;
   a suspension beam vertically disposed extending in a space between the vacuum chamber and inner chamber, the suspension beam being coupled to the sample stage ring base, the suspension beam being configured to suspend the sample stage and support the sample stage from above; and
   a piping disposed on an inner side of the suspension beam and the support beam, the piping through which a liquid to be supplied to an inside of the sample stage is circulated,
   wherein in a state in which the cover member is placed on the vacuum chamber and an inside of the vacuum chamber is hermetically sealed,
   the inner chamber is placed on the sample stage ring base and an inside of the inner chamber is hermetically sealed to the vacuum chamber and is hermetically sealed to an outside of the vacuum chamber,
   the suspension beam is vertically movably held a space sandwiched between a sample stage base plate and the cover member of the vacuum container, the sample stage base plate having an upper part configuring the upper part of the vacuum chamber, the sample stage base plate covering an inside of the vacuum container, and
   the plasma processing apparatus includes a conductive connector held on the sample stage base plate being sandwiched between the sample stage base plate and an upper member made of SUS of the suspension beam.

2. The plasma processing apparatus according to claim 1, comprising:
   an electrode in a disk shape to which first radio frequency electric power is supplied to form plasma in a space above the sample stage in the inside of the inner chamber disposed below the cover member; and
   a grounded member disposed in a ring shape on an outer circumference side of the electrode in a disk shape in a plate shape, the grounded member being at a ground potential,
   wherein the grounded member is electrically connected to the sample stage base plate.

3. The plasma processing apparatus according to claim 1, wherein: the inner chamber has a flange part disposed on an upper end portion of the inner chamber, a position of the flange part is fixed with the flange part sandwiched between the sample stage base plate and the cover member in a state in which the cover member is placed; and
   an upper end portion of the sample stage ring base is held with a sealing member sandwiched below a lower end portion of the inner chamber with a spacing to the lower end portion.

4. The plasma processing apparatus according to claim 1, wherein: a sealing member is disposed between the sample stage base plate and the grounded member;
   the inside of the vacuum chamber is hermetically sealed from an outside; and
   the conductive connector is located in the inside of the vacuum chamber hermetically sealed.

5. The plasma processing apparatus according to claim 1, wherein: the suspension beam includes a lower member disposed below the upper member made of SUS, the lower member being made of aluminum or an alloy of aluminum; and
a lower end portion of the upper member is disposed on the inner chamber, and the lower end portion being located above an opening through which a wafer to be processed using the plasma is transferred.

* * * * *